(12) United States Patent
Gong et al.

(10) Patent No.: US 11,574,936 B2
(45) Date of Patent: Feb. 7, 2023

(54) DISPLAY PANEL, PREPARATION METHOD THEREOF, AND DISPLAY DEVICE

(71) Applicants: BOE MLED TECHNOLOGY CO., LTD., Beijing (CN); BOE Technology Group Co., Ltd., Beijing (CN)

(72) Inventors: Linhui Gong, Beijing (CN); Chao Liu, Beijing (CN); Haiwei Sun, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/201,198

(22) Filed: Mar. 15, 2021

(65) Prior Publication Data
US 2022/0068972 A1 Mar. 3, 2022

(30) Foreign Application Priority Data
Sep. 1, 2020 (CN) .......................... 202010903366.5

(51) Int. Cl.
*H01L 27/12* (2006.01)
*H01L 25/16* (2006.01)
*H01L 27/32* (2006.01)

(52) U.S. Cl.
CPC .......... *H01L 27/124* (2013.01); *H01L 25/167* (2013.01); *H01L 27/1259* (2013.01); *H01L 27/3276* (2013.01)

(58) Field of Classification Search
None
See application file for complete search history.

(56) References Cited

U.S. PATENT DOCUMENTS

| 2007/0228397 | A1* | 10/2007 | Taninaka | ................... B41J 2/45 257/E25.02 |
| 2008/0121903 | A1* | 5/2008 | Hiramatsu | .......... H01L 21/0237 257/89 |
| 2018/0233515 | A1* | 8/2018 | Choi | ................. H01L 21/31105 |
| 2021/0240043 | A1* | 8/2021 | Wang | .................... H01L 23/528 |

FOREIGN PATENT DOCUMENTS

CN 109752891 A * 5/2019

* cited by examiner

*Primary Examiner* — Bo B Jang
(74) *Attorney, Agent, or Firm* — ArentFox Schiff LLP; Michael Fainberg (57) ABSTRACT

A display panel, a preparation method thereof, and a display device are disclosed. The display panel includes: a plurality of pixel units arranged in an array; a plurality of first signal lines extending in a first direction and arranged in a second direction; and a plurality of first connecting electrodes arranged in the second direction; where the first direction intersects with the second direction. The plurality of pixel units form m pixel rows arranged in sequence along the first direction and each extending along the second direction, where m is an integer greater than 1; and a projection of at least one pixel unit in an m-th pixel row on a plane perpendicular to the second direction and projections of the first connecting electrodes on the plane perpendicular to the second direction have an overlapped area.

20 Claims, 9 Drawing Sheets

DISPLAY PANEL, PREPARATION METHOD THEREOF, AND DISPLAY DEVICE

CROSS REFERENCE TO RELATED APPLICATION

This application is based on and claims priority under 35 U.S.C 119 to Chinese Patent Application No. 202010903366.5, filed on Sep. 1, 2020, in the China National Intellectual Property Administration. The entire disclosure of the above application is incorporated herein by reference.

FIELD

The disclosure relates to the field of display technology, in particular to a display panel, a preparation method thereof, and a display device.

BACKGROUND

Micro-LED technology aims to make inorganic light emitting diodes be thinner, minimized and arranged in an array. Micro-LED modules are generally tiled to create micro-LED based extra-large display, and there are seams between each tile. Since the bezel of one small micro-LED module is relatively large, the non-display seam area of the extra-large display is generally large, which affects the display effect.

SUMMARY

Embodiments of the disclosure provide a display panel, a preparation method thereof, and a display device.

Embodiments of the disclosure provide a display panel. The display panel includes: a plurality of pixel units arranged in an array; a plurality of first signal lines extending in a first direction and arranged in a second direction; and a plurality of first connecting electrodes arranged in the second direction; where the first direction intersects with the second direction. The plurality of pixel units form m pixel rows arranged in sequence along the first direction and each extending along the second direction, where m is an integer greater than 1; and a projection of at least one pixel unit in an m-th pixel row on a plane perpendicular to the second direction and projections of the first connecting electrodes on the plane perpendicular to the second direction have an overlapped area.

Embodiments of the disclosure provide a preparation method of the display panel above. The method includes: forming a plurality of pixel units arranged in an array on a base substrate, and forming a plurality of first signal lines extending along a first direction and electrically connected to the plurality of pixel units, where the plurality of pixel units form m pixel rows arranged in sequence along the first direction with each extending along the second direction, where m is an integer greater than 1; and forming first connecting electrodes electrically connected to the first signal lines in one-to-one correspondence on the base substrate by a magnetron sputtering process with a magnetron sputtering mask, where the first connecting electrodes are arranged along the second direction, and a projection of at least one pixel unit in the m-th pixel row on a plane perpendicular to the second direction and projections of the first connecting electrodes on the plane perpendicular to the second direction have an overlapped area.

Embodiments of the disclosure provide a display device, which includes a display panel including: a plurality of pixel units arranged in an array; a plurality of first signal lines extending in a first direction and arranged in a second direction; and a plurality of first connecting electrodes arranged in the second direction; where the first direction intersects with the second direction. The plurality of pixel units form m pixel rows arranged in sequence along the first direction and each extending along the second direction, where m is an integer greater than 1; and a projection of at least one pixel unit in an m-th pixel row on a plane perpendicular to the second direction and projections of the first connecting electrodes on the plane perpendicular to the second direction have an overlapped area.

BRIEF DESCRIPTION OF THE DRAWINGS

To describe technical solutions in the embodiments of the disclosure more clearly, drawings to be used in description of the embodiments will be introduced briefly below. Obviously, the drawings described below merely represent some embodiments of the disclosure, and those of ordinary skill in the art can obtain other drawings according to these drawings without creative work.

DETAILED DESCRIPTION OF THE EMBODIMENTS

To make the objectives, technical solutions and advantages of the embodiments of the disclosure clearer, the technical solutions in the embodiments of the disclosure will be described clearly and completely in conjunction with the accompanying drawings in the embodiments of the disclosure. Obviously, the described embodiments are only a part of the embodiments of the disclosure, and not all the embodiments. Moreover, the embodiments in the disclosure and the features in the embodiments can be combined with each other without conflict. Based on the embodiments described herein, all other embodiments obtained by those of ordinary skill in the art without creative work shall fall into the protection scope of the disclosure.

Unless otherwise defined, technical or scientific terms used in the disclosure shall have ordinary meanings understood by those of ordinary skill in the art to which the disclosure pertains. The words "first", "second" and the like used in present disclosure do not indicate any order, quantity or importance, but are only used to distinguish different components. Words such as "comprise" or "include" mean that an element or item appearing before such a word covers listed elements or items appearing after the word and equivalents thereof, and does not exclude other elements or items. Words such as "connect" or "interconnect" are not limited to physical or mechanical connections, but may include electrical connections, regardless of direct or indirect connection.

It should be noted that sizes and shapes in the drawings do not reflect the true scale, and are merely intended to schematically illustrate the disclosure. Furthermore, same or similar reference numerals throughout represent same or similar elements or elements having same or similar functions.

It is to be noted that in the related art, pad groups are provided in peripheral regions of a display panel to lead signal lines on the front side of the display panel to the back side for a bonding process, and the signal lines on the front side of the display panel extend to the peripheral regions of the display panel and are correspondingly connected to the pads in the pad groups, and there are gaps between pixels in display regions of the pad groups, so it is difficult for the display panel to achieve narrow or no borders, and when a plurality of display panels are spliced to obtain a large-size display screen, the sizes of seam regions between adjacent display panels are large, which affects the display effect and the user experience.

Figure 1:
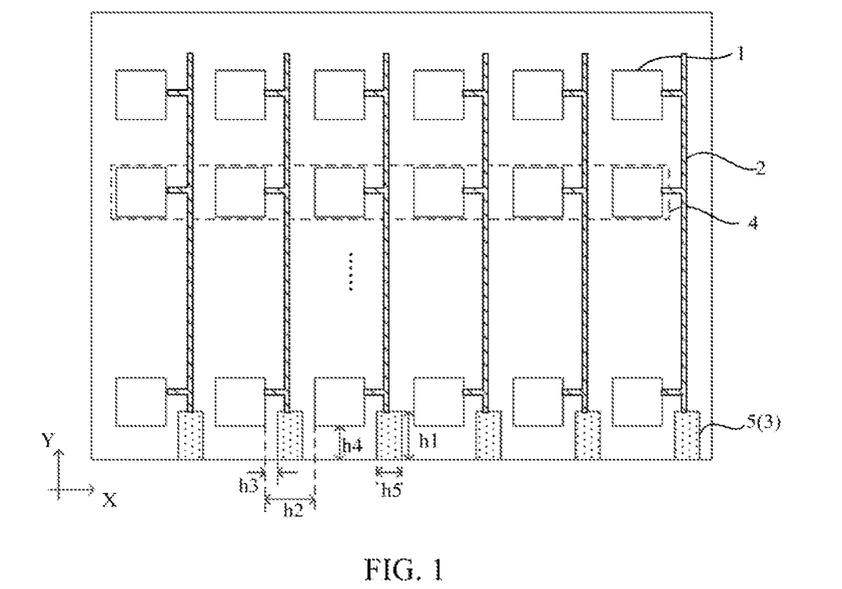
FIG. 1 is a schematic structural diagram of a display panel according to some embodiments.

Embodiments of the disclosure provide a display panel. As shown in FIG. 1, the display panel includes a plurality of pixel units 1 arranged in an array, a plurality of first signal lines 2 extending in a first direction Y and arranged in a second direction X, and a plurality of first connecting electrodes 3 arranged in the second direction X, where the first direction Y intersect with the second direction X.

The plurality of pixel units form m pixel rows 4 extending in the second direction X and arranged in the first direction Y, where m is an integer greater than 1.

A projection of at least one pixel unit 1 in the m-th pixel row 4 on a plane perpendicular to the second direction X and projections of the first connecting electrodes 3 on the plane perpendicular to the second direction X have an overlapped area.

In the display panel provided by the embodiment of the disclosure, an orthographic projection of at least one pixel unit in the m-th pixel row on a plane perpendicular to the second direction and orthographic projections of the first connecting electrodes on the plane perpendicular to the second direction have an overlapped area. That is, the first connecting electrodes are provided between the pixel units, thus the first connecting leads can be electrically connected to the first signal lines in the display area, so that the size of the bezel area of the display panel can be reduced.

In some embodiments, as shown in FIG. 1, the first connecting electrode 3 includes: a first sub-electrode 5 extending along the first direction Y. A plurality of the first sub-electrodes 5 are arranged at intervals along the second direction X.

A projection of at least one pixel unit 1 in the m-th pixel row 4 on the plane perpendicular to the second direction X and projections of the first sub-electrodes 5 on the plane perpendicular to the second direction X have an overlapped area.

In some embodiments, as shown in FIG. 1, a length h1 of each first sub-electrode 5 along the first direction Y and a distance h2 between two adjacent pixel units 1 in the second direction X satisfy: $0.26 < h1/h2 < 1.5$. The length h1 may be in the range of 70 μm to 150 μm; and the distance h2 may be in the range of 100 μm to 270 μm.

In some embodiments, as shown in FIG. 1, a distance h3 between a pixel unit 1 and an adjacent first sub-electrode 5 in the second direction X and the distance h2 between two adjacent pixel units 1 in the second direction X satisfy: $0.1 < h3/h2 < 0.85$. The distance h2 may be in the range of 100 μm to 270 μm, and the distance h3 may be in the range of 30 μm to 85 μm.

The relationship between the length h1 of each first sub-electrode 5 along the first direction Y and a distance h2 between two adjacent pixel units 1 in the second direction X, and the relationship between the distance h3 between the pixel unit 1 and an adjacent first sub-electrode 5 in the second direction X and the distance h2 between two adjacent pixel units 1 in the second direction X are set in such a manner that conduction between the first sub-electrodes and the pixel units can be avoided.

A distance h4 between a pixel unit 1 in the m-th pixel row 4 and an edge of the display panel in the first direction Y may be in the range of 30 μm to 100 μm. A length h5 of the first sub-electrode 5 in the second direction X and the length h1 of the first sub-electrode 5 in the first direction Y satisfy: $2 < h1/h5 < 4$. The length h1 and the distance h4 satisfy: (h1−h4) is greater than 40 μm. In the second direction, a distance between a pixel unit closest to the edge of the display panel and the edge of the display panel may be in the range of 80 μm to 400 μm.

In some embodiments, as shown in FIG. 1, orthographic projections of the first connecting sub-electrodes 5 on a plane where the display panel is located are rectangular. Of course, the first connecting electrodes may also be in other shapes.

Figure 2:
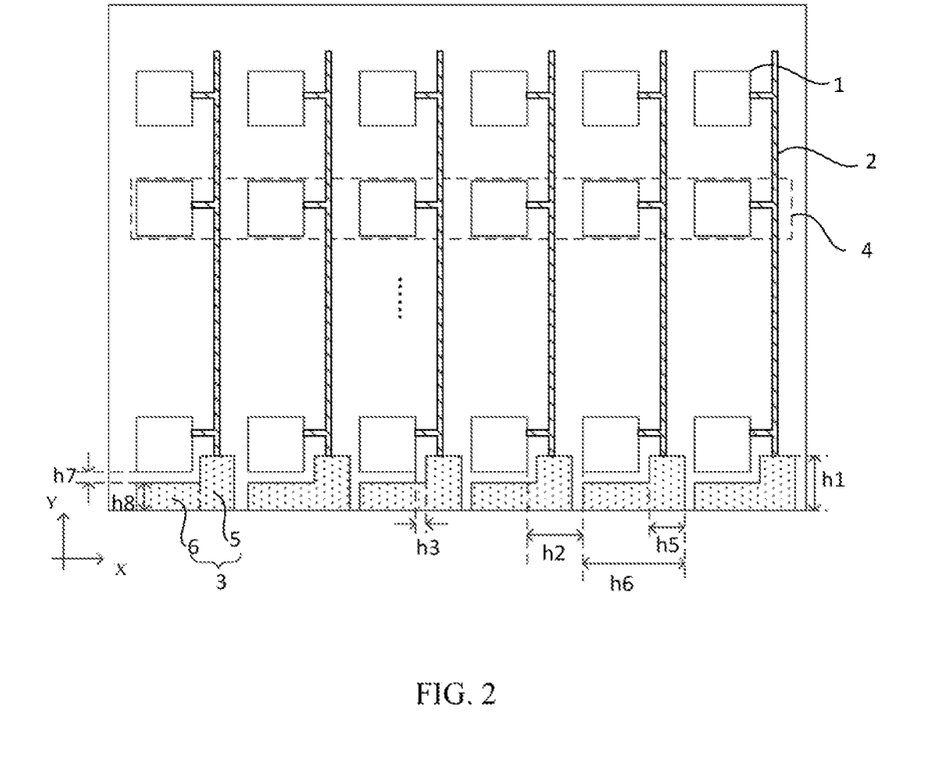
FIG. 2 is a schematic structural diagram of another display panel according to some embodiments.

In some embodiments, as shown in FIG. 2, the first connecting electrode 3 further include: a second sub-electrode 6 extending along the second direction X, where the second sub-electrode 6 and the first sub-electrode 5 form an integral structure. The second sub-electrode 6 are at least located on one side of the first sub-electrode 5, that is, orthographic projection of the first connecting electrode on the plane where the display panel is located is L-shaped or inverted T-shaped.

In the display panel provided by the embodiment of the disclosure, in addition to the first sub-electrode extending in the first direction, the first connecting electrode further includes the second sub-electrode extending in the second direction and integrated with the first sub-electrode. As such, the contact area of the first connecting electrode can be increased, which not only reduces a risk of circuit break of the connecting electrode, but also reduces the contact resistance of the first connecting electrode.

In some embodiments, as shown in FIG. 2, a length h8 of each second sub-electrode 6 in the first direction Y and the distance h2 between two adjacent pixel units in the second direction X satisfy: $0.1<h8/h2<1$. Thus, unnecessary electric connection between the second sub-electrodes and the pixel units can be avoided and the bezel size of the display panel can be controlled.

In some embodiments, as shown in FIG. 2, in the case where the orthographic projection of the first connecting electrode on the plane where the display panel is located is L-shaped, the distance h3 between the pixel unit 1 and the adjacent first sub-electrode 5 in the second direction X and the distance h2 between two adjacent pixel units in the second direction X satisfy: $0.1<h3/h2<1$. In some embodiments, the length h1 may be in the range of 70 µm to 150 µm. In some embodiments, a distance h7 between the pixel unit 1 in the m-th pixel row 4 and the second sub-electrode 6 in the first direction Y may be in the range of 10 µm to 30 µm; and the length h8 of the second sub-electrode 6 in the first direction Y may be in the range of 30 µm to 100 µm. The distance h2 may be in the range of 100 µm to 270 µm; the distance h3 may be in the range of 30 µm to 85 µm, the length h5 of the first sub-electrode 5 in the second direction X may be in the range of 40 µm to 100 µm; and a maximum length h6 of the first connecting electrode 3 in the second direction X may be in the range of 180 µm to 400 µm. The length h5 and the length h1 satisfy: $2<h1/h5<4$. A difference between the length h1 and the length h8 satisfy: (h1−h8) is greater than 40 µm. In the first direction Y, a distance between a pixel unit closest to the edge of the display panel and the edge of the display panel may be in the range of 80 µm to 400 µm.

In some embodiments, as shown in FIG. 2, in the respective first connecting electrodes 3, the second sub-electrodes 6 are located on same sides of the first sub-electrodes 5.

Figure 3:
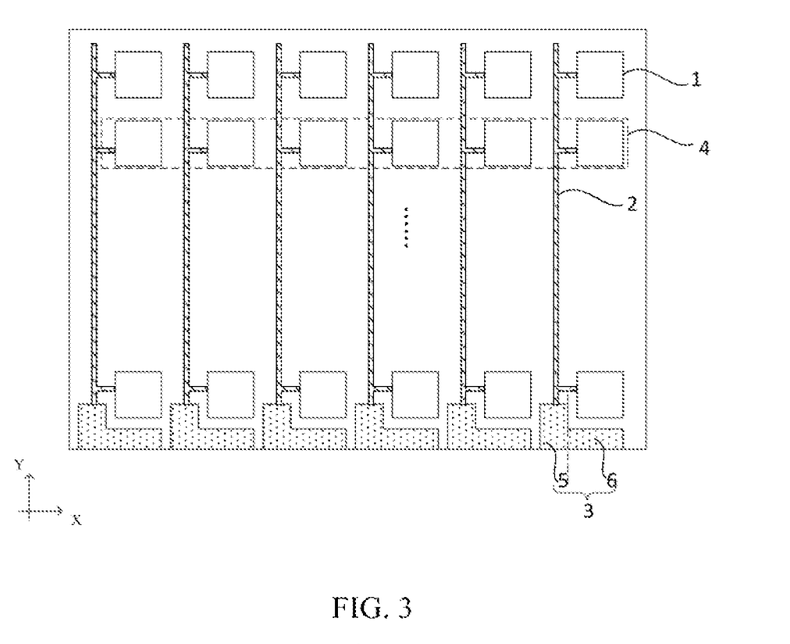
FIG. 3 is a schematic structural diagram of yet another display panel according to some embodiments.

In FIG. 2, the second sub-electrodes 6 are all located on the left sides of the first sub-electrodes 5 as an example for illustration. Of course, it is also possible that as shown in FIG. 3, the second sub-electrodes 6 are all located on the right sides of the first sub-electrodes 5. Which sides of the first sub-electrodes the second sub-electrodes are located may be selected according to actual needs.

Figure 4:
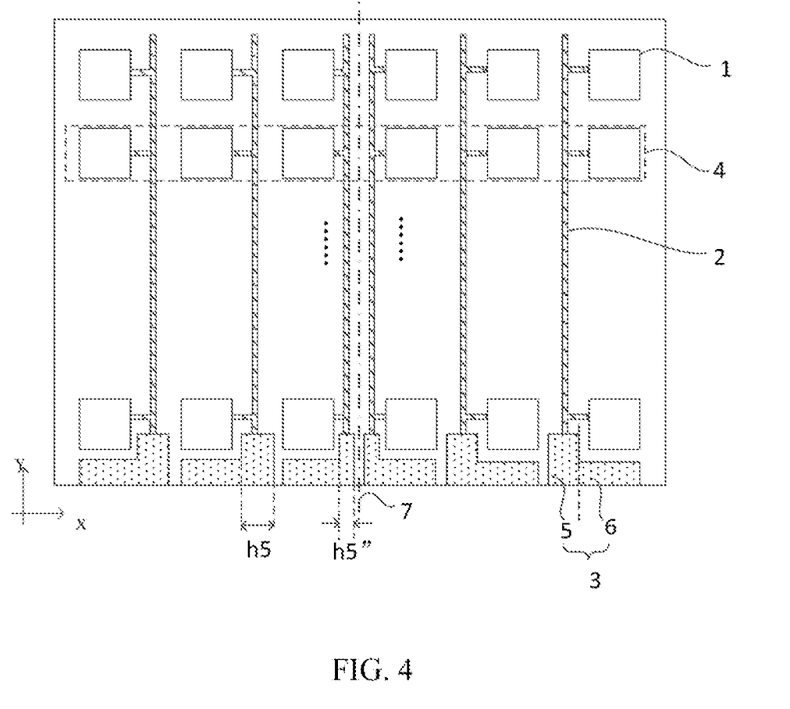
FIG. 4 is a schematic structural diagram of still another display panel according to some embodiments.

In some embodiments, as shown in FIG. 4, the first connecting electrodes 3 are arranged axisymmetrically on two sides of a symmetry axis 7 of the display panel parallel to the first direction Y. The second sub-electrodes 6 on a same side of the symmetry axis 7 are located on same sides of the first sub-electrodes 5, and the second sub-electrodes 6 on different sides of the symmetry axis 7 are located on different sides of the first sub-electrode 5.

As shown in FIG. 4, in the first connecting electrodes 3 on the left side of the symmetry axis 7, the second sub-electrodes 6 are all located on the left sides of the first sub-electrodes 5, and in the first connecting electrodes 3 on the right side of the symmetry axis 7, the second sub-electrodes 6 are all located on the right sides of the first sub-electrodes 5.

In some embodiments, in the m-th pixel row, one first connecting electrode or a plurality of first connecting electrodes may be provided between two adjacent pixel units. In the case where the number of first connecting electrode(s) provided between some two adjacent pixel units is a, and the number of first connecting electrode(s) provided between other two adjacent pixel units is (a+b), to ensure that distances between the adjacent pixel units in the second direction X are equal, in the second direction X, a length of each first sub-electrode in the (a+b) first connecting electrodes is smaller than a length of each first sub-electrode in the a first connecting electrode(s), where a and b are both positive integers.

For example, as shown in FIG. 4, two first connecting electrodes 3 are provided between two adjacent pixel units 1 on two sides of the symmetry axis 7, and one first connecting electrode 3 is provided between other two adjacent pixel units 1. A length h5″ in the second direction X of each first sub-electrode 5 in the first connecting electrodes 3 on two sides of the symmetry axis 7 is smaller than a length h5 in the second direction X of each first sub-electrode 5 in the other first connecting electrodes 3.

In some embodiments, in the case where one first connecting electrode is provided between every two adjacent pixel units, lengths of the first sub-electrodes in the first connecting electrodes along the second direction are same.

In some embodiments, the first connecting electrodes are connected to the first signal lines in a one-to-one correspondence manner, that is, the number of the first connecting electrodes is same as the number of the first signal lines. The number of the first signal lines is related to the driving mode of the display panel, the arrangement of sub-pixels in the pixel units, and the like. The number of the first signal lines may be same as the number of pixel columns, and the number of the first signal lines may also be greater than the number of the pixel columns. When the number of the first signal lines is greater than the number of the pixel columns, a plurality of first connecting electrodes need to be provided between some pixel columns. The number of the first connecting electrodes that need to be provided between two adjacent pixel units may be selected according to a pixel pitch, the number of the first signal lines, the way a thin film transistor controls the pixels, the size of the display panel, and the like.

In some embodiments, the first signal lines may be, for example, data lines.

In some embodiments, the pixel units include light emitting diodes. The light emitting diodes may be, for example, micro inorganic light emitting diodes. In some embodiments, the micro inorganic light emitting diodes may be a current light emitting diode, such as micro light emitting diodes (Micro LEDs) or mini light emitting diodes (Mini LEDs). The light emitting diodes may also be, for example, organic light emitting diodes (OLEDs).

In some embodiments, in the case where the pixel units include light emitting diodes, the light emitting diodes may be driven to emit light by a driving chip (IC) in cooperation with a data selector, or the light emitting diodes may also be driven to emit light by a thin film transistor. In the case where the light emitting diodes are driven to emit light by an IC, the number of the first signal lines may be set to be same as the number of the pixel columns. In the case where the light emitting diodes are driven to emit light by a thin film transistor, the number of the first signal lines may be greater than the number of the pixel columns, and a plurality of first connecting electrodes may be provided between some pixel columns.

In some embodiments, each pixel unit includes a red sub-pixel, a blue sub-pixel, and a green sub-pixel arranged along the first direction or the second direction.

Figure 5:
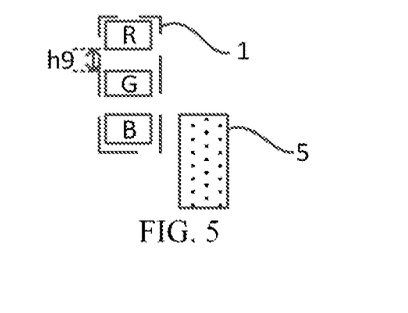
FIG. 5 is a schematic diagram illustrating the layout of sub-pixels in a display panel according to some embodiments.
Figure 6:
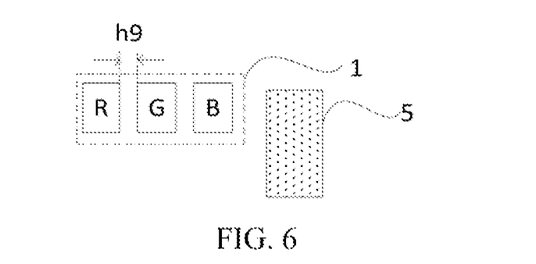
FIG. 6 is a schematic diagram illustrating the layout of sub-pixels in another display panel according to some embodiments.
Figure 7:
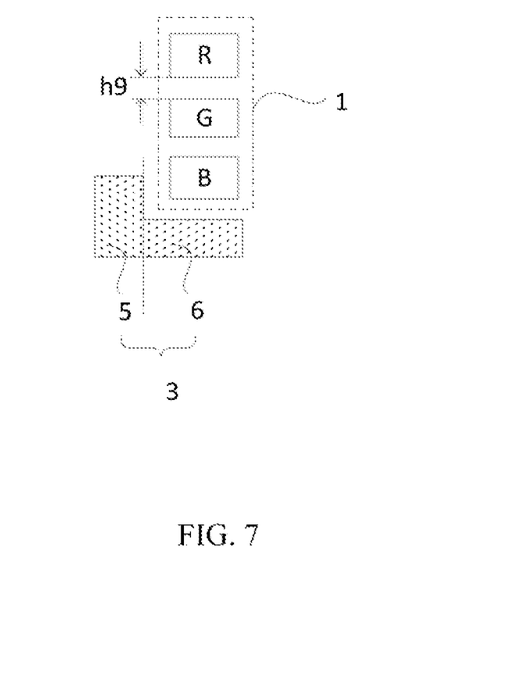
FIG. 7 is a schematic diagram illustrating the layout of sub-pixels in yet another display panel according to some embodiments.
Figure 8:
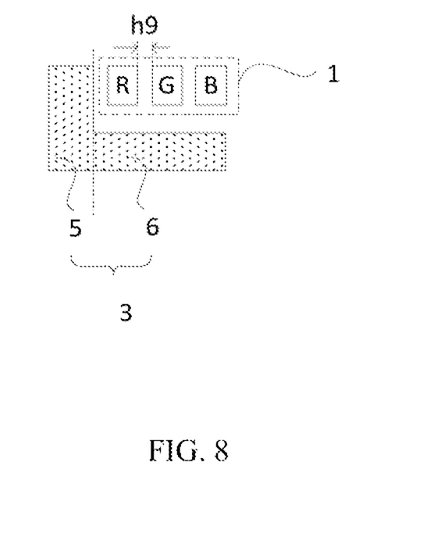
FIG. 8 is a schematic diagram illustrating the layout of sub-pixels in still another display panel according to some embodiments.
Figure 9:
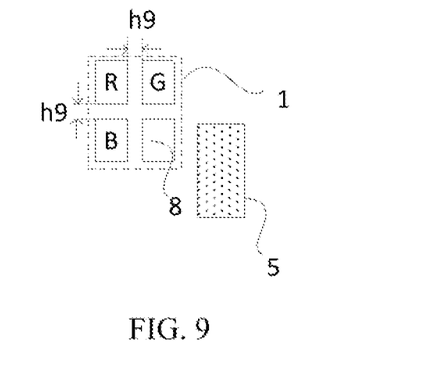
FIG. 9 is a schematic diagram illustrating the layout of sub-pixels in still yet another display panel according to some embodiments.
Figure 10:
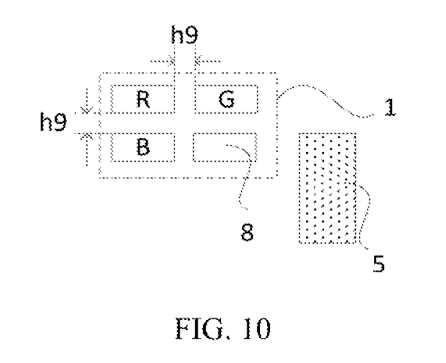
FIG. 10 is a schematic diagram illustrating the layout of sub-pixels in further another display panel according to some embodiments.
Figure 11:
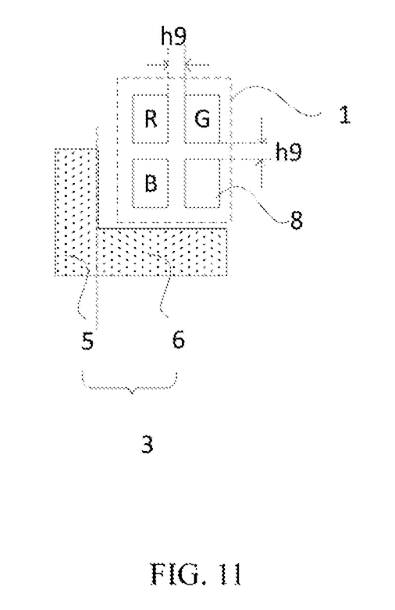
FIG. 11 is a schematic diagram illustrating the layout of sub-pixels in even another display panel according to some embodiments.
Figure 12:
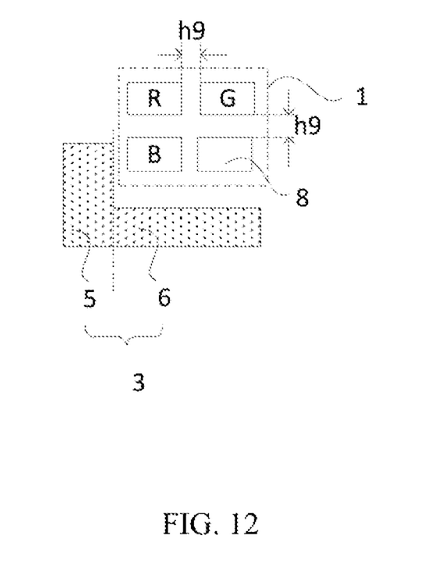
FIG. 12 is a schematic diagram illustrating the layout of sub-pixels in still further another display panel according to some embodiments.

As shown in FIGS. 5 and 7, the red sub-pixel R, the green sub-pixel G, and the blue sub-pixel B in the pixel unit 1 are arranged along the first direction. As shown in FIGS. 6 and 8, the red sub-pixel R, the green sub-pixel G, and the blue sub-pixel B in the pixel unit 1 are arranged along the second direction.

In some embodiments, as shown in FIGS. 9, 10, 11 and 12, each pixel unit 1 includes a red sub-pixel R, a blue sub-pixel B, a green sub-pixel G, and a functional sub-pixel 8 arranged in two rows and two columns. In some embodiments, the specific arrangement order of the sub-pixels in each pixel unit may be selected according to actual needs.

In some embodiments, in the case where the light emitting diodes are micro inorganic light emitting diodes, the red sub-pixel, the blue sub-pixel, and the green sub-pixel respectively include a red micro inorganic light emitting diode, a blue micro inorganic light emitting diode, and a green micro inorganic light emitting diode. In the case where the functional sub-pixel is used as a spare sub-pixel. For example the display sub-pixels such as the red sub-pixel, the blue sub-pixel, and the green sub-pixel can work normally, there is no need to provide a micro inorganic light emitting diode in the functional sub-pixel. If the micro inorganic light emitting diode in any one of the red sub-pixel, the blue sub-pixel, and the green sub-pixel is damaged, a micro inorganic light emitting diode of a corresponding color may be provided in the functional sub-pixel to ensure a display effect of the pixel. The functional sub-pixel may also include a white micro inorganic light emitting diode, which cooperates with the red micro inorganic light emitting diode, the blue micro inorganic light emitting diodes, and the green micro inorganic light emitting diode to improve color performance and contrast of the display panel.

In some embodiments, in the case where the light emitting diodes are organic electroluminescent diodes, the red sub-pixel, the blue sub-pixel, and the green sub-pixel respectively include a red organic electroluminescent diode, a blue organic electroluminescent diode, and a green organic electroluminescent diode, and the functional sub-pixel includes a white organic electroluminescent diode, to improve color performance and contrast of the display panel.

FIG. 5 to FIG. 12 only show sub-pixels in one pixel unit, and one first connecting electrode to illustrate the positional relationship between the sub-pixels and the first connecting electrode.

In some embodiments, in the case where each pixel unit includes sub-pixels arranged in two rows and two columns, a distance h9 between the sub-pixels may be in the range of 20 μm to 70 μm. The distance h3 between the pixel unit and the adjacent first sub-electrode in the second direction and the distance h9 between the sub-pixels satisfy: 1<h3/h9<4.

Figure 13:
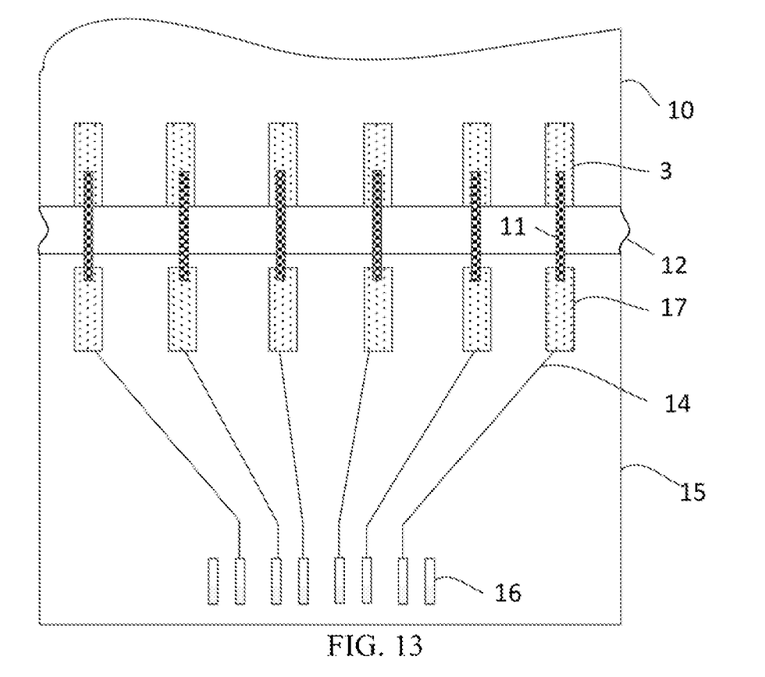
FIG. 13 is a schematic structural diagram of still even another display panel according to some embodiments.

In some embodiments, the display panel provided by the embodiments of the disclosure may be applied to a large-size display device, that is, a plurality of display panels provided by the embodiments of the disclosure may be tiled to create a large-size display device. As shown in FIG. 13, in the display panel provided by the embodiments of the disclosure, the first connecting electrodes 3 are provided on a front side 10 (i.e. display region) of the display panel. The display panel further includes: second connecting electrodes 17 provided on a back side 15 of the display panel, and a plurality of lateral leads 11, main bodies of which are located on a side surface 12 of the display panel, and which bring the plurality of first sub-electrodes included in each first connecting electrode 3 and a plurality of third sub-electrodes included in each second connecting electrode 17 respectively into connection in one-to-one correspondence. In some embodiments, the back side of the display panel further includes pads 16 for bonding a driving chip (IC), the pads 16 being connected to the second connecting electrodes 17 through fan-out leads 14. With this configuration, the display panel provided by the embodiments of the disclosure has extremely narrow bezel. When a plurality of display panels are tiled to create a large-size display device, a distance between two adjacent columns or rows of pixel units in two adjacent display panels may be almost equal to a distance between two adjacent columns or rows of pixel units located in a same display panel, that is, seams between the tiles may be considered to be almost invisible.

In some embodiments, to facilitate illustration of the connecting relationship between the first connecting electrodes, the second connecting electrodes, the lateral leads, the fan-out leads and the pads, in FIG. 13, the front and back sides and one lateral side connecting the front and back sides of the display panel are shown on a same plane.

Figure 14:
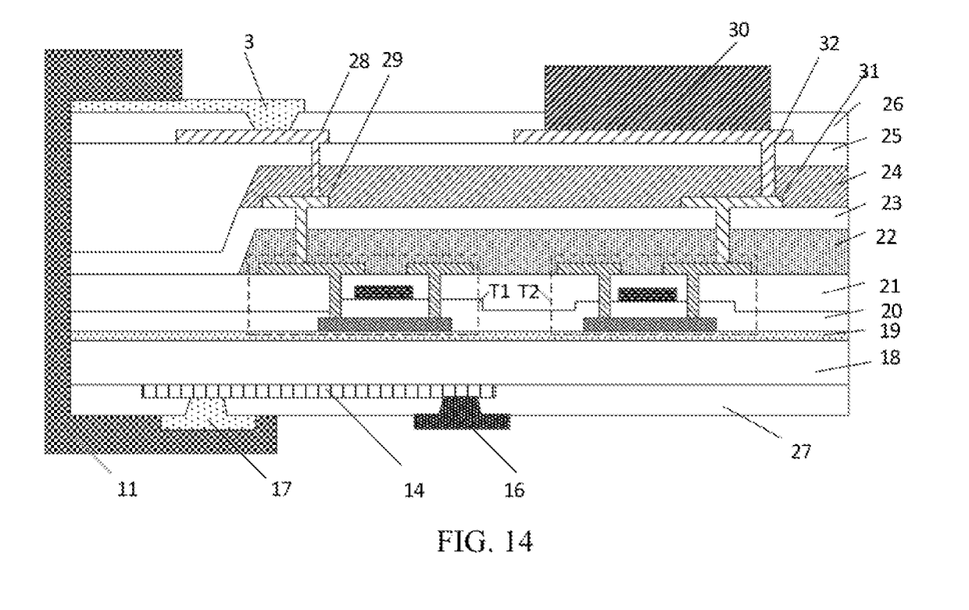
FIG. 14 is a cross sectional view of a display panel according to some embodiments.

In some embodiments, using a thin film transistor to drive a light emitting diode to emit light as an example, as shown in FIG. 14, the display panel includes a base substrate 18; a buffer layer 19 disposed on the base substrate 18; an active layer of a switching transistor T1 and an active layer of a driving transistor T2 disposed on the buffer layer 19; a gate insulating layer 20 disposed on the active layer of the switching transistor T1 and the active layer of the driving transistor T2; a gate of the switching transistor T1 and a gate of the driving transistor T2 disposed on the gate insulating layer 20; a first insulating layer 21 disposed on the gate of the switching transistor T1 and the gate of the driving transistor T2; a source and a drain of the switching transistor T1, a source and a drain of the driving transistor T2, and a data line connected to the source of the switching transistor T1, disposed on the first insulating layer 21; a first planarization layer 22 on the source and the drain of the switching transistor T1 and the source and the drain of the driving transistor T2; a first passivation layer 23 on the first planarization layer 22; a second sub-signal line 29 and a first connecting lead 31 on the first passivation layer 23, the second sub-signal line 29 being connected to the data line through a via hole running through the first planarization layer 22 and the first passivation layer 23, and the first connecting lead 31 being connected to the drain of the driving transistor T2 through a via hole running through the first planarization layer 22 and the first passivation layer 23; a second planarization layer 24 on the second sub-signal line 29 and the first connecting lead 31; a second passivation layer 25 on the second planarization layer 24; a first sub-signal line 28 and a second connecting lead 32 on the second passivation layer 25, the first sub-signal line 28 being connected to the second sub-signal line 29 through a via hole running through the second planarization layer 24 and the second passivation layer 25, and the second connecting lead 32 being connected to the first connecting lead 31 through a via hole running through the second planarization layer 24 and the second passivation layer 25; a third passivation layer 26 on the first sub-signal line 28 and the second connecting lead 32; a light emitting diode 30 electrically connected to the second connecting lead 32 through a via hole running through the third passivation layer 26; a fan-out lead 14 disposed on a side of the base substrate 18 away from the buffer layer 19; a fourth passivation layer 27 on the side of the fan-out lead 14 facing away from the base substrate 18; and a pad 16 and a second connecting electrode 17 provided on the fourth passivation layer 27, where the pad 16 and the second connecting electrode 17 are connected to the fan-out lead 14 through a via hole running through the fourth passivation layer 27; and the first sub-signal line 28 is connected to the first connecting electrode 3, and the first connecting electrode 3 is connected to the second connecting electrode 17 through a lateral lead 11. The first signal lines include: the first sub-signal line 28, the second sub-signal line 29, and the data line.

FIG. 14 only shows some components for illustration in the pixel units, for example, the switching transistor T1, the driving transistor T2, and the light emitting diode 30. The pixel units may also include, for example, a threshold compensation transistor, a storage capacitor, and other structures. In some embodiments, the types and numbers of devices in the pixel units may be selected according to actual needs. FIG. 14 is described by using an example in which the switching transistor T1 and the driving transistor T2 are thin film transistors with a top-gate structure. Of course, in practical applications, the thin film transistors in the pixel units may also have a bottom-gate structure.

In some embodiments, the shapes of the second connecting electrode and the first connecting electrode are same, that is, orthographic projections of a plurality of first connecting electrodes and a plurality of second connecting electrodes on the base substrate of the display panel substantially coincide. Of course, the shapes of the second connecting electrode and the first connecting electrode may also be different, but it needs to ensure that the orthographic projections of each first connecting electrode and the corresponding second connecting electrode on the base substrate of the display panel at least partially coincide.

The display panel shown in FIGS. 1 to 4 provided by the embodiments of the disclosure is described by using an example in which the first connecting electrodes are provided on one sides of the pixel units arranged in an array, in the first direction as an example. In some embodiments, the first connecting electrodes may also be provided on two sides of the pixel units arranged in an array, in the first direction, and the shapes and related parameters of the first connecting electrodes on the two sides may be same, for example, the first connecting electrodes on the two sides may be axisymmetrically distributed on two sides of a symmetry axis of the display panel extending parallel to the second direction.

Figure 15:
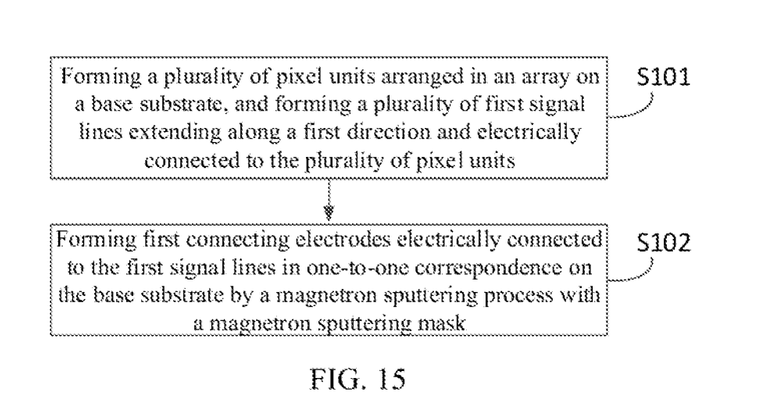
FIG. 15 is a schematic flow chart of a preparation method of a display panel according to some embodiments.

Based on the same inventive concept, embodiments of the disclosure further provides a preparation method of a display panel, as shown in FIG. 15, the method including:

S101, forming a plurality of pixel units arranged in an array on a base substrate, and forming a plurality of first signal lines extending along a first direction and electrically connected to the pixel units, wherein the plurality of pixel units forms m pixel rows arranged in sequence along the first direction and each extending along a second direction, where m is an integer greater than 1; and S102, forming first connecting electrodes electrically connected to the first signal lines in one-to-one correspondence on the base substrate by a magnetron sputtering process with a magnetron sputtering mask, wherein the first connecting electrodes are arranged along the second direction, and a projection of at least one pixel unit in the m-th pixel row on a plane perpendicular to the second direction and projections of the first connecting electrodes on the plane perpendicular to the second direction have an overlapped area.

In the formation of the connecting electrodes in the related art, the display region is usually shielded by attaching a film, and a metal conductive layer is formed on the entire surface of a region where the connecting electrodes are to be provided, and then a pattern of the connecting electrodes is formed by using a laser etching process or a wet etching process. However, in the above solution of forming the connecting electrode pattern, considering etching precision and an affected zone, a large-area region needs to be reserved, resulting in a large size of a bezel region. The use of the laser process or the wet etching process also increases the preparation cost and preparation time, and if the distances between the connecting electrodes and the sub-pixels are close, micro inorganic light emitting diodes in sub-pixels are liable to be damaged by a heat affected zone of laser etching or a solution of wet etching.

In the preparation method of a display panel provided by the embodiment of the disclosure, as the pattern of the first connecting electrodes is formed by using the magnetron sputtering mask and the magnetron sputtering process, without adding an etching process, the fabrication time and cost of the first connecting electrodes can be saved, and there is no need to reserve a large-area region for forming the first connecting electrodes, thus the size of the bezel region can be further reduced, and damage to the micro inorganic light emitting diodes in the sub-pixels can be avoided.

Figure 16:
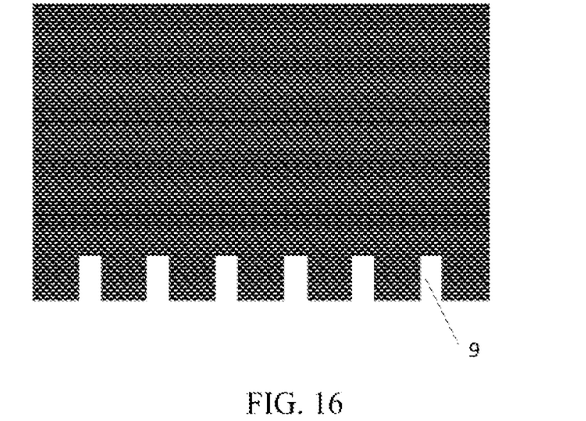
FIG. 16 is a schematic diagram of a magnetron sputtering mask according to some embodiments.
Figure 17:
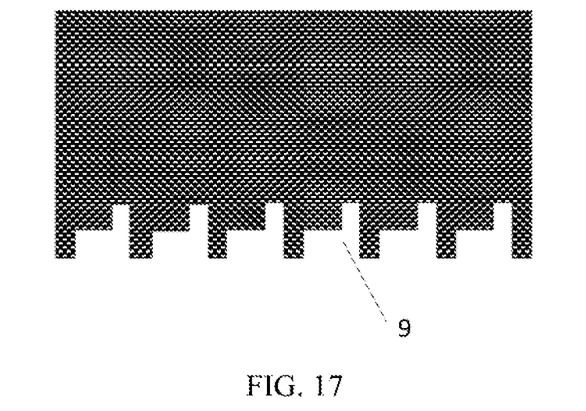
FIG. 17 is a schematic diagram of another magnetron sputtering mask provided in an embodiment of the present invention.

In some embodiments, for example, stainless steel, glass, or other material may be used to prepare a magnetron sputtering mask with openings of similar shapes to the first connecting electrodes. In the case where the first connecting electrodes to be formed are rectangular, as shown in FIG. 16, the openings 9 of the magnetron sputtering mask are rectangular. In the case where the first connecting electrodes to be formed are L-shaped, as shown in FIG. 17, the openings 9 of the magnetron sputtering mask are L-shaped. FIGS. 16 and 17 are described by using a mask used when the first connecting electrodes are provided on one sides of the pixel units arranged in an array as an example.

Figure 18:
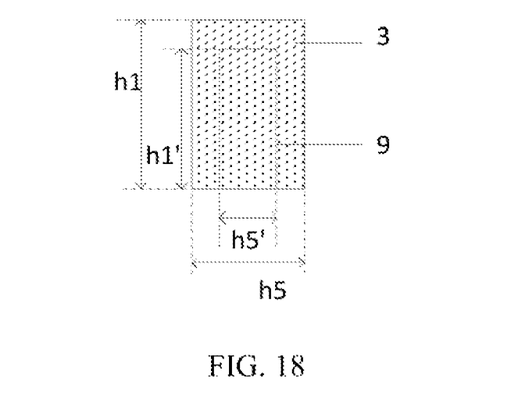
FIG. 18 is a schematic diagram illustrating sizes of an opening of a magnetron sputtering mask and a first connecting electrode according to some embodiments.
Figure 19:
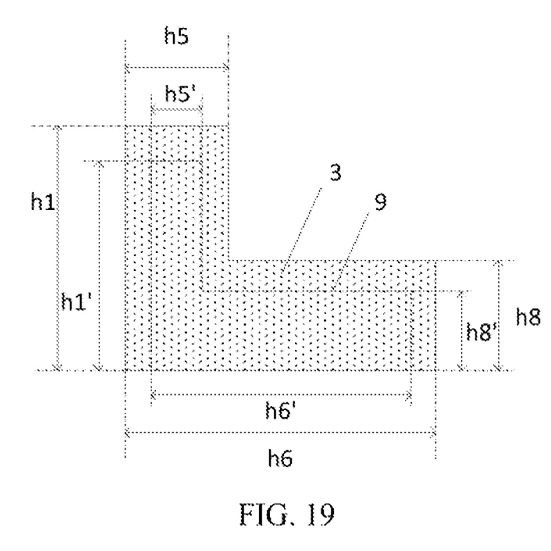
FIG. 19 is a schematic diagram illustrating sizes of an opening of another magnetron sputtering mask and a first connecting electrode according to some embodiments.

Considering the issue of process precision in some embodiments, the sizes of the openings of the magnetron sputtering mask may be smaller than the sizes of the first connecting electrodes. In the case where the first connecting electrodes are rectangular, as shown in FIG. 18, a length h1' of each opening 9 of the magnetron sputtering mask along the first direction and the length h1 of each first sub-electrode 5 along the first direction satisfy: $0.4 \leq h1'/h1 \leq 0.6$, and a length h5' of the opening 9 of the magnetron sputtering mask along the second direction and the length h5 of the first sub-electrode 5 in the second direction satisfy: $0.5 \leq h5'/h5 \leq 0.9$. In the case where the first connecting electrodes are L-shaped, as shown in FIG. 19, a length h1' of each opening 9 of the magnetron sputtering mask along the first direction and the length h1 of each first sub-electrode 5 along the first direction satisfy: $0.4 \leq h1'/h1 \leq 0.6$; a minimum length h5' of the opening 9 of the magnetron sputtering mask along the second direction and the length h5 of the first sub-electrode 5 in the second direction satisfy: $0.5 \leq h5'/h5 \leq 0.9$; a maximum length h6' of the opening 9 of the magnetron sputtering mask along the second direction and the maximum length h6 of the first connecting electrode 3 in the second direction satisfy: $0.5 \leq h6'/h6 \leq 0.9$; and a minimum length h8' of the opening 9 of the magnetron sputtering mask along the first direction and the length h8 of the second sub-electrode 6 along the first direction satisfy: $0.4 \leq h8'/h8 \leq 0.6$. For example, a distance between an edge of the opening of the magnetron sputtering mask and an edge of the electrode that actually needs to be formed may be 20 μm. Regions enclosed by dotted lines in FIGS. 18 and 19 represent regions of the openings 9 of the magnetron sputtering mask.

In some embodiments, forming first connecting electrodes electrically connected to the first signal lines in one-to-one correspondence on the base substrate by using a magnetron sputtering mask and a magnetron sputtering process may, for example, include:

aligning the magnetron sputtering mask with the display panel;

placing a protective cover on the magnetron sputtering mask; and forming a pattern of the first connecting electrodes by a magnetron sputtering process.

In some embodiments, when the display panel provided by the embodiments of the disclosure is applied to a spliced display device, the above-mentioned magnetron sputtering mask may also be used to form a pattern of second connecting electrodes on the back side of the display panel: the magnetron sputtering mask is aligned with the display panel, and a protective cover is placed on a side of the magnetron sputtering mask away from the display panel, and the pattern of the second connecting electrodes is formed by the magnetron sputtering process; and then lateral leads are fabricated to connect the first connecting electrodes and the second connecting electrodes. In this way, an individual display panel used in a spliced display device can achieve an ultra-narrow border or even no border.

An embodiment of the disclosure provides a display device, which includes the display panel according to some embodiments.

The display device provided in the embodiment of the disclosure may be a mobile phone, a tablet computer, a television, a display, a notebook computer, a digital photo frame, a navigator, or any other product or component with a display function. Other indispensable components of the display device are present as understood by those skilled in the art, and are not described herein, nor should they be construed as limiting the disclosure. For the implementation of the display device, reference may be made to the embodiments of the display panel described above, and repeated description is omitted.

In some embodiments, the display device provided by the embodiment of the disclosure may be formed by splicing a plurality of display panels provided by embodiments of the disclosure.

In the display panel, the preparation method thereof, and the display device provided by the embodiments of the disclosure, an orthographic projection of at least one pixel unit in the m-th pixel row on a plane perpendicular to the second direction and orthographic projections of the first connecting electrodes on the plane perpendicular to the second direction have an overlapped area, that is, the first connecting electrodes are provided between the pixel units, and a first connecting lead is electrically connected to a first signal line in a display region, so that the size of a bezel region of the display panel can be reduced, which is beneficial to achieving narrow bezel display, and the display effect and the user experience can be improved.

Obviously, those skilled in the art can make various modifications and variations to the disclosure without departing from the spirit and scope of the disclosure. Thus, the disclosure is also intended to encompass these modifications and variations thereto so long as the modifications and variations come into the scope of the claims of the disclosure and their equivalents.

What is claimed is:

1. A display panel comprising:
a plurality of pixel units arranged in an array;
a plurality of first signal lines extending in a first direction and arranged in a second direction; and
a plurality of first connecting electrodes arranged in the second direction; wherein the first direction intersects with the second direction;
wherein
the plurality of pixel units form m pixel rows arranged in sequence along the first direction and each extending along the second direction, where m is an integer greater than 1; and
an m-th pixel row among the m pixel rows is closest to an edge of the display panel, a respective one of the plurality of first connecting electrodes is located between two adjacent pixel units in the m-th pixel row, an end of the respective one of the plurality of first connecting electrodes is connected with a respective one of the plurality of first signal lines, another end of the respective one of the plurality of first connecting electrodes is connected with a driving circuit of the display panel; a projection of at least one pixel unit in the m-th pixel row on a plane perpendicular to the second direction and projections of the first connecting electrodes on the plane perpendicular to the second direction have an overlapped area.

2. The display panel of claim 1, wherein the plurality of first connecting electrodes each comprises: a first sub-electrode extending along the first direction;
wherein
the first sub-electrodes are arranged at intervals along the second direction; and
the projection of the at least one pixel unit in the m-th pixel row on the plane perpendicular to the second direction and projections of the first sub-electrodes on the plane perpendicular to the second direction have an overlapped area.

3. The display panel of claim 2, wherein a length h1 of each first sub-electrode along the first direction and a distance h2 between two adjacent pixel units along the second direction satisfy: 0.26<h1/h2<1.5.

4. The display panel of claim 2, wherein a distance h3 between a pixel unit and a first sub-electrode adjacent to the pixel unit along the second direction and a distance h2 between two adjacent pixel units in the second direction satisfy: 0.1<h3/h2<0.85.

5. The display panel of claim 2, wherein the plurality of first connecting electrodes each further comprises: a second sub-electrode extending along the second direction, wherein
the second sub-electrodes and the first sub-electrodes form an integral structure; and
the second sub-electrodes are at least located at one sides of the first sub-electrodes.

6. The display panel of claim 5, wherein a length h8 of each second sub-electrode along the first direction and a distance h2 between two adjacent pixel units in the second direction satisfy: 0.1<h8/h2<1.

7. The display panel of claim 5, wherein second sub-electrodes of at least a part of the plurality of first connecting electrodes are located at same sides of first sub-electrodes of the at least a part of the plurality of first connecting electrodes.

8. The display panel of claim 7, wherein the first connecting electrodes are arranged axisymmetrically at two sides of a symmetry axis of the display panel extending parallel to the first direction; and second sub-electrodes at a same side of the symmetry axis are located at same sides of the first sub-electrodes, and second sub-electrodes at different sides of the symmetry axis are located at different sides of the first sub-electrodes.

9. The display panel of claim 1, wherein the plurality of pixel units each comprises a light emitting diode device.

10. The display panel of claim 1, wherein each pixel unit comprises a red sub-pixel, a blue sub-pixel, and a green sub-pixel arranged along the first direction or the second direction.

11. The display panel of claim 1, wherein each pixel unit comprises a red sub-pixel, a blue sub-pixel, a green sub-pixel, and a spare sub-pixel arranged in two rows and two columns.

12. A preparation method of the display panel of claim 1, comprising:
    forming the plurality of pixel units arranged in the array on a base substrate;
    forming the plurality of first signal lines extending along the first direction and electrically connected to the plurality of pixel units;
    forming the first connecting electrodes electrically connected to the first signal lines in one-to-one correspondence on the base substrate by a magnetron sputtering process with a magnetron sputtering mask.

13. A display device, comprising a display panel, wherein the display panel comprises:
    a plurality of pixel units arranged in an array;
    a plurality of first signal lines extending in a first direction and arranged in a second direction; and
    a plurality of first connecting electrodes arranged in the second direction; wherein the first direction intersects with the second direction;
    wherein
    the plurality of pixel units form m pixel rows arranged in sequence along the first direction and each extending along the second direction, where m is an integer greater than 1; and
    an m-th pixel row among the m pixel rows is closest to an edge of the display panel, a respective one of the plurality of first connecting electrodes is located between two adjacent pixel units in the m-th pixel row, an end of the respective one of the plurality of first connecting electrodes is connected with a respective one of the plurality of first signal lines, another end of the respective one of the plurality of first connecting electrodes is connected with a driving circuit of the display panel; a projection of at least one pixel unit in the m-th pixel row on a plane perpendicular to the second direction and projections of the first connecting electrodes on the plane perpendicular to the second direction have an overlapped area.

14. The display device of claim 13, wherein the plurality of first connecting electrodes each comprises: a first sub-electrode extending along the first direction;
    wherein
    the first sub-electrodes are arranged at intervals along the second direction; and
    the projection of the at least one pixel unit in the m-th pixel row on the plane perpendicular to the second direction and projections of the first sub-electrodes on the plane perpendicular to the second direction have an overlapped area.

15. The display device of claim 14, wherein a length h1 of each first sub-electrode along the first direction and a distance h2 between two adjacent pixel units along the second direction satisfy: $0.26 < h1/h2 < 1.5$.

16. The display device of claim 14, wherein a distance h3 between a pixel unit and a first sub-electrode adjacent to the pixel unit along the second direction and a distance h2 between two adjacent pixel units in the second direction satisfy: $0.1 < h3/h2 < 0.85$.

17. The display device of claim 14, wherein the plurality of first connecting electrodes each further comprises: a second sub-electrode extending along the second direction, wherein
    the second sub-electrodes and the first sub-electrodes form an integral structure; and
    the second sub-electrodes are at least located at one sides of the first sub-electrodes.

18. The display device of claim 17, wherein a length h8 of each second sub-electrode along the first direction and a distance h2 between two adjacent pixel units in the second direction satisfy: $0.1 < h8/h2 < 1$.

19. The display device of claim 17, wherein second sub-electrodes of at least a part of the plurality of first connecting electrodes are located at same sides of first sub-electrodes of the at least a part of the plurality of first connecting electrodes.

20. The display device of claim 19, wherein the first connecting electrodes are arranged axisymmetrically at two sides of a symmetry axis of the display panel extending parallel to the first direction; and
    second sub-electrodes at a same side of the symmetry axis are located at same sides of the first sub-electrodes, and second sub-electrodes at different sides of the symmetry axis are located at different sides of the first sub-electrodes.

* * * * *